United States Patent [19]

Risch et al.

[11] Patent Number: 4,966,859
[45] Date of Patent: Oct. 30, 1990

[54] VOLTAGE-STABLE SUB-μM MOS TRANSISTOR FOR VLSI CIRCUITS

[75] Inventors: Lothar Risch, Ottobrunn; Reinhard Tielert, Munich; Wolfgang Mueller, Putzbrunn; Christoph Werner, Krailling, all of Fed. Rep. of Germany

[73] Assignee: Siemens Aktiengesellschaft, Berlin and Munich

[21] Appl. No.: 293,567

[22] Filed: Jan. 3, 1989

Related U.S. Application Data

[62] Division of Ser. No. 462,401, Jan. 31, 1983, abandoned.

[30] Foreign Application Priority Data

Mar. 9, 1982 [DE] Fed. Rep. of Germany ....... 3208500

[51] Int. Cl.$^5$ ......................................... H01L 21/266
[52] U.S. Cl. ......................................... 437/29; 437/30; 437/41; 148/DIG. 126
[58] Field of Search ............................ 437/29, 30, 41; 148/DIG. 126

[56] References Cited

FOREIGN PATENT DOCUMENTS

| | | | |
|---|---|---|---|
| 53-80172 | 7/1978 | Japan | 357/23 SC |
| 53-84571 | 7/1978 | Japan | 357/23 SC |
| 56-32757 | 4/1981 | Japan | 357/23 SC |

OTHER PUBLICATIONS

Yoshida et al., "Thermal Stability and Secondary Breakdown in Planar Power MOSFET's," IEEE Trans. on Electron Devices, vol. ED-27, No. 2, 2/80, pp. 395-398.

Konaka et al., "Suppression of Anomalous Drain Current in Short Channel MOSFET," Jap. Jour. Applied Physics, vol. 18 (1979), Supplement 18-1, pp. 27-33.

IEEE Journal of Sol. Stat. Circuits vol. Sc-9 No. 5, Oct., 1974, pp. 256-268.

IEEE Trans. on Elecktro Devices vol. ED-24, No. 3, Mar., 1977, pp. 196-204.

Primary Examiner—Olik Chaudhuri
Assistant Examiner—O. Ojan
Attorney, Agent, or Firm—Hill, Van Santen, Steadman & Simpson

[57] ABSTRACT

A voltage-stable sub-μm-MOS transistor for VLSI circuits consist of a low-resistant silicon substrate of a first conductivity type with a high-resistant, thin, epitaxial layer of the first conductivity type situated thereon and on which a gate electrode consisting of polysilicon is disposed. Highly doped source/drain zones of the second conductivity type form a channel region of the first conductivity type. A doping substance concentration, rising in the direction of the substrate, is generated by means of double implantation, whereby the concentration maximum extends to behind the source/drain zones. A method for manufacturing same incorporates steps of forming the several layers, applying a mask, executing a double implantation in the channel region, and forming the gate electrode.

3 Claims, 2 Drawing Sheets

VOLTAGE-STABLE SUB-μM MOS TRANSISTOR FOR VLSI CIRCUITS

This is a division, of U.S. patent application Ser. No. 462,401, filed Jan. 31, 1983, now abandoned.

FIELD OF THE INVENTION

This invention relates to a voltage-stable MOS transistor for VLSI circuits having a semiconductor substrate of a first conductivity type and a planarly disposed epitaxial layer thereon, with an overlying insulating layer and, on the latter, a gate electrode consisting of polysilicon. Highly doped source and drain zones of the second conductivity type are generated, extending into the surface area, and a zone of the first conductivity type functioning as a channel zone is disposed between the source and drain zones, exhibiting a different concentration of implanted doping substance in the direction toward the substrate. The invention also relates to a method for manufacturing the aforesaid MOS transistor.

BACKGROUND

The Prior Art

Due to continuing miniaturization of integrated MOS circuits, transistors having channel lengths less than 1.5 μm are required which operate with the standard voltage of 5 volts (−2.5 volts substrate voltage). The poor reproducibility of the threshold voltage represents a difficult technical problem. This is because of fluctuations in channel length or insufficient voltage stability as the result of avalanche multiplication, especially when coupled with a bipolar effect.

It is known from the prior art, for example the article by R. H. Dennard et al "Design of Ion-Implanted MOS-FET's With Very Small Physical Dimensions" in IEEE Solid State Circuits, Vol. SC-9, pp. 256 through 268, 1974, to resolve this problem by using a MOS transistor constructed on a high-resistant substrate which receives a double implantation in the channel region and exhibits reduced source/drain penetration depths as well as a thin gate oxide.

The idea of double implantation in the channel region, for example, in a publication by P. P. Wang, in the IEEE, ED-24 (1977), pp. 196 through 204, is not fully exploited in practice. Specifically, a far smaller dose is selected for the deep implantation than would be optimum for shielding the drain voltage from the source, so as not to reduce the turnover voltage stability of the transistor.

Other ideas, such as double-implanted MOS structures, double-diffused MOS structures, MOS structures with buried zones, MOS structures with separate gates and weakly doped drain zones are likewise known for resolving the problem, but involve greater complexity and poorer reproducibility of the long channel threshold voltage as disadvantages.

BRIEF DESCRIPTION OF THE INVENTION

An object of the present invention is to provide a MOS transistor for VLSI circuits (sub-μm range) which exploits the advantages of a deep implantation with high dose on the short channel effect of the threshold voltage and thereby avoids the breakdown of the transistor at relatively low drain voltages A further object of the present invention is to provide a method for manufacturing the aforesaid MOS transistor, which is as simple as possible to execute.

These objects are achieved by a transistor of the initially specified type which is characterized by having the following features:

(a) the substrate of the first conductivity type is lowresistant material and the epitaxial layer is highresistant material and of the same conductivity type as the substrate;

(b) the epitaxial layer exhibits a layer thickness which maximally amounts to ten times the depth of the source/drain zones, but which amounts at least to twice the depth of the concentration maximum of the doping substance particles implanted in the channel zone; and (c) the channel region of the first conductivity type exhibits an increasing doping concentration in the direction of the substrate, whereby the concentration maximum of the implanted doping substance of the first conductivity type in the channel region of the first conductivity type extends to behind the source/drain zone of the second conductivity type, such that the region with the concentration maximum of the implanted doping substance surrounds the edge of the source/drain zone in the region of the gate electrode.

Further embodiments and further developments of the invention will be apparent from the following description and the accompanying drawings.

The following considerations have led to the invention; the short channel effect on the threshold voltage is greatly reduced, due to the influence of the deep implantation. It has been discovered during investigations of the breakdown behavior that, at the beginning of the avalanche multiplication of the channel current, the hole current flowing off to the substrate effects a voltage drop. This voltage drop leads to an internal bias voltage of the MOS transistor which increases the channel current. Given further increase of the substrate current, the bipolar effect then occurs. Accordingly, the substrate assumes the role of a base of a bipolar transistor, so that an additional current which leads to breakdown of the MOS transistor is now injected over the layer sequence now corresponding to emitter, base, and collector.

The transistor of the present invention suppresses this voltage drop, generated by the avalanche multiplication current, because the MOS structure is constructed on a low-resistance substrate and a thin, high-resistant epitaxial layer is situated thereon. Thus, the internal bias voltage and bipolar effect are largely eliminated and, thus, a higher drain voltage of the MOS transistor is achieved. Moreover, the overlap of the channel doping with the source/drain implantation is reduced using an additional implantation for the channel implantation before source/drain implantation and thus the circuit speed of the transistor is increased. In this way, epitaxial layer assumes the realization of the low-doped zone.

BRIEF DESCRIPTION OF THE DRAWINGS

Reference will now be made to the accompanying drawings, in which.

For purposes of greater clarity, illustrations of adjacent regions of the transistor such as, for example, the insulation regions (LOCOS regions) separating the active transistor regions, have been omitted.

DESCRIPTION OF THE PREFERRED EMBODIMENT

The manufacture of an n-channel MOS transistor is described on the basis of FIGS. 1 through 4. The same reference symbols apply to identical parts in all Figures.

Figure 1:
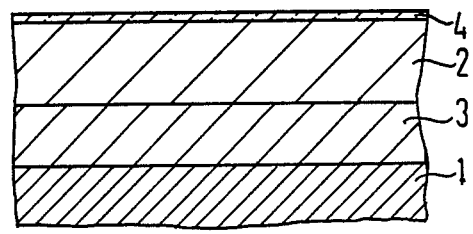
FIGS. 1 through 4 show cross-sectional views of a transistor constructed in accordance with the invention, at several successive stages of manufacture.

As shown in FIG. 1, a highly doped silicon substrate body 1 ($p^{++} \approx 10^{17} cm^{-3}$), which is $\approx 500$ μm thick, has a lower doped epitaxial silicon layer 2 ($p^- \approx 1 \times 10^{15} cm^{-3}$), such layer having been precipitated on its surface from the gaseous phase with a layer thickness of 2 μm. During this growth, an intermediate layer 3 is formed between the substrate 1 and the layer 2, as a result of diffusion from the substrate 1. An insulation layer 4 consisting of $SiO_2$ with a layer thickness of less than 30 nm is grown on the substrate (1, 2, 3) coated in that manner, said insulation layer 4 being later employed in specific regions of the circuit as gate oxide.

Figure 2:
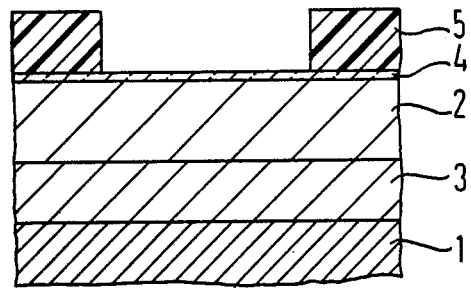
Figure 3:
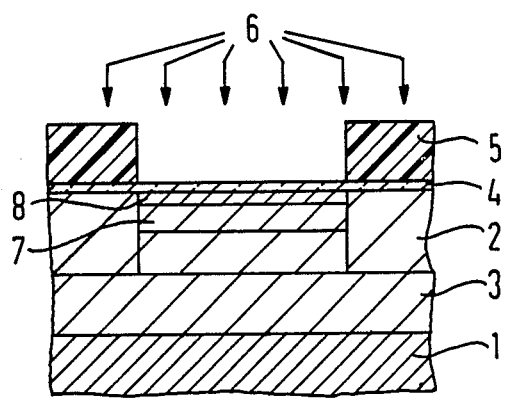

As shown in FIG. 2, an implantation mask 5, consisting of photosensitive resist is applied to the substrate (1, 2, 3) provided with the $SiO_2$ layer 4, in such manner that the gate regions remain free for functioning later in the transistor.

With the assistance of this implantation mask 5, a double implantation of the channel region with doping substance particles consisting of boron ions 6 is then executed (FIG. 3), whereby the deep implantation (see region 7) simultaneously generates the field implantation. The improvement of the short channel effect on the threshold voltage and the improvement of the differential threshold behavior is then achieved by means of the plateau-like doping profile of the regions 7 and 8 which is produced by the double implantation 6. The region 7 having the high doping serves to shield the potential at the source at the surface and in the volume (SDIBL, VDIBL) from the drain voltage.

Typical implantation parameters for the deep implantation (region 7) are 1 through $3 \times 10^{12} B$ $cm^{-2}$ at 140 keV. The threshold voltage of the transistor is set in the region 8 with the flat boron implantation and the lower dose. Typical implantation values are 2 through $6 \times 10^{11} B$ $cm^{-2}$ at 25 keV.

Figure 4:
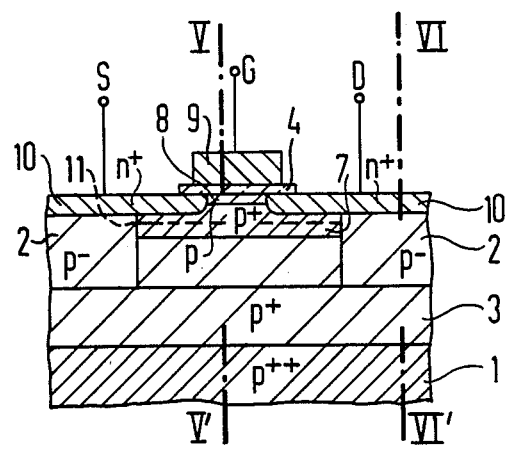

After completion of the boron double implantation 6, the resist mask 5 is removed and the polysilicon gate material and electrode material are applied in a known manner, and the gate electrode 9 is structured (FIG. 4). Upon employment of the gate electrode 9 as an implantation mask, the source/drain regions 10 are then generated in a known manner by means of an arsenic implantation, whereby a range from 0.3 through 0.4 μm is set for the depth of these regions. As shown in FIG. 4, the concentration maximum of the boron implantation (i.e., the dotted line 11) is overlain by (or is located beneath) lies behind the source/drain regions 10 (in contrast to the structure disclosed on page 263 of Dennard, in which the source/drain zones extend deeper into the substrate than the deep implantation). FIG. 4 shows the inventive transistor structure provided with the source/drain and gate terminals, S, D and G, respectively.

Figure 5:
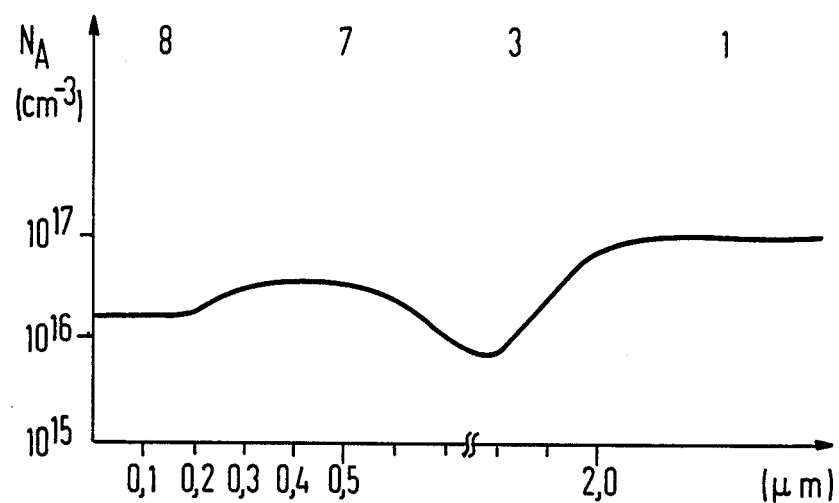
FIGS. 5 and 6 show sections through characteristic transistor regions and the concentration curve along section lines V—V', and VI—VI' in FIG. 4.
Figure 6:
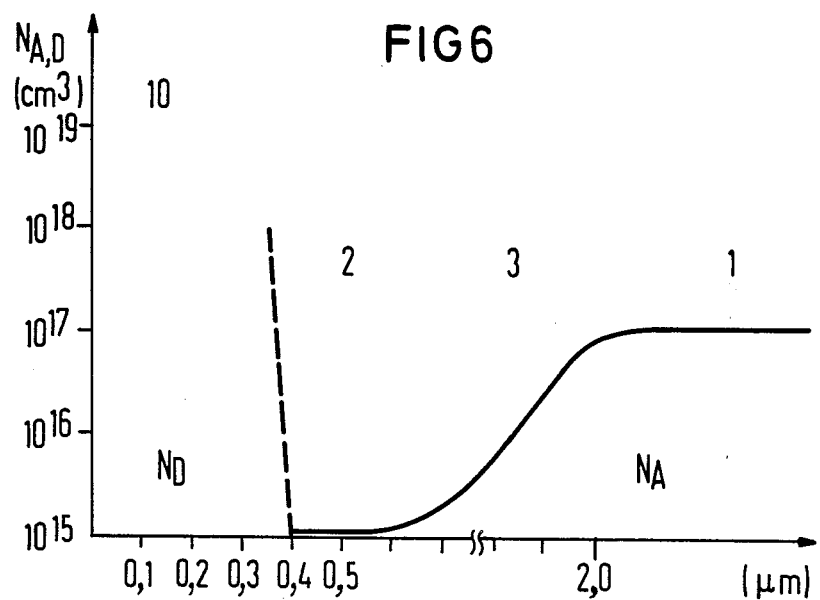

FIG. 5 shows the concentration curve $N_A$ ($cm^{-3}$) along the section line V—V' in FIG. 4 (the channel region); and FIG. 6 shows the concentration curve $N_{A,D}$ $cm^{-3}$ along the section line VI—VI' in FIG. 4 (the source/drain region). The individual doping regions (1, 2, 3, 7, 8 and 10) are indicated in FIGS. 5 and 6. $N_A$ and $N_D$ denote acceptor and donor concentrations respectively.

The disadvantages of reversing the classical doping profile (as described, for example, in Wang and Dennard) on other transistor properties, such as n+ substrate capacitance and avalanche-induced bipolar effects, are compensated by the doping regions 1, 2, 3.

The n+ substrate capacitance is reduced by the low-doped epitaxial region 2, given simultaneous increase of the breakdown voltage of the pn junction. The broken line in FIG. 6 indicates the position of the pn junction. The non-self-adjusting implantation mask for the channel region can be reliably adjusted with an overlap of 0.5—1.0 μm, using the current state of the art.

The internal bias voltage of the transistor, and the turn on of the parasitic bipolar transistor, are prevented by the low-resistant regions 1 and 3. Due to the drop of the doping concentration between the maximum of 11 of the implantation and the substrate 1, the substrate body effect is reduced at high substrate voltages so that the transistor can also be employed as a transfer gate. The tail of the doping substance concentration 7 should therefore overlap with the tail of the substrate doping 3 in order to avoid punch-through effects.

It will be clear to those skilled in the art that various modifications or additions may be made in the present invention, which is intended to be defined and secured by the appended claims.

What is claimed is:

1. A method for manufacturing a voltage-stable short-channel MOS transistor having a sub-μm channel length with the following characteristics;
   (a) a semiconductor substrate of a first conductivity type and an epitaxial layer planarly disposed thereupon and an insulating layer disposed on said epitaxial layer, a gate electrode disposed on said insulating layer, said electrode consisting of polysilicon, said epitaxial layer having highly doped source and drain zones of the second conductivity type extending into its surface region, with a region of the first conductivity type functioning as a channel zone disposed between the source and drain zones, said region exhibiting a different concentration of implanted doping substance in the direction of the substrate;
   (b) the substrate of the first conductivity type is formed of low-resistant material and the epitaxial layer is formed of high-resistant material and of the same conductivity type as the substrate;
   (c) the epitaxial layer has a thickness which maximally amounts to ten times the depth of the source/drain zones but which at least amounts to twice the depth of the concentration maximum of the doping substance implanted in the channel zone;
   (d) the channel region of the first conductivity type exhibits an increasing doping concentration in the direction of the substrate, whereby the concentration maximum of the implanted doping substance of the first conductivity type in the channel region of the first conductivity type is overlain by the source and drain zones of the second conductivity type, such that the region with the concentration maximum of the implanted doping substance shields the edges of the source and drain zones in the region of the gate electrode;
   said method comprising the steps of:

(e) precipitating an epitaxial, p-doped silicon layer with a layer thickness in the range from 1.5 through 5 μm on a lower-resistant substrate consisting of p-conductive silicon;

(f) growing thereon an insulating layer for use as a gate oxide layer;

(g) applying an implantation mask consisting of photosensitive resist such that the gate region of the transistor to be produced layer remains free thereof;

(h) executing a double implantation in the channel region by means of superimposing a deep and flat boron ion implantation by means of setting different implantation energies and doses, said deep boron ion implantation being performed with a higher dose than said flat boron ion implantation;

(i) removing the implantation mask;

(j) generating and structuring the gate electrode consisting of polysilicon; and (k) executing the source-drain implantation at the outer surface of said epitaxial layer to form said source and drain zones at a level less deep than the level of maximum concentration of said deep boron ion implantation, using the gate electrode as an implantation mask whereby the source and drain zones each overlie and overlap a part of said deep boron ion implantation.

2. The method according to claim 1, wherein the gate oxide layer thickness $d_{ox}$ is set to less than 30 nm.

3. The method according to claim 1, wherein the dose and energy of said flat boron ion implantation are set to 2 through $6 \times 10^{11} cm^{-2}$ and 25 keV, and the dose and energy of the said deep boron ion implantation are set to 1 through $3 \times 10^{12} cm^{-2}$ and 140 keV.

* * * * *